United States Patent
Kossel et al.

(10) Patent No.: US 7,479,839 B1
(45) Date of Patent: Jan. 20, 2009

(54) VARACTOR BANK SWITCHING BASED ON NEGATIVE CONTROL VOLTAGE GENERATION

(75) Inventors: Marcel A. Kossel, Reichenburg (CH); Thomas E. Morf, Gross (CH); Jonas R. Weiss, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/059,886

(22) Filed: Mar. 31, 2008

(51) Int. Cl.
  *H03B 5/12* (2006.01)
(52) U.S. Cl. .............................. 331/177 V; 331/117 R; 331/117 FE; 331/185; 331/167
(58) Field of Classification Search .............. 331/177 V, 331/167, 117 R, 117 FE
See application file for complete search history.

(56) References Cited

U.S. PATENT DOCUMENTS

| | | | |
|---|---|---|---|
| 3,693,093 | A | 9/1972 | Russell |
| 4,602,222 | A | 7/1986 | Wynn |
| 5,752,179 | A | 5/1998 | Dobrovolny |
| 6,323,736 | B2 | 11/2001 | Jansson |
| 6,774,736 | B1 | 8/2004 | Kwek et al. |
| 6,778,022 | B1 | 8/2004 | Zhang et al. |
| 7,071,790 | B2 | 7/2006 | Darabi et al. |
| 7,221,234 | B2 | 5/2007 | Chien |
| 7,230,503 | B1 | 6/2007 | Huang |
| 7,239,180 | B1 | 7/2007 | Shumarayev |
| 7,332,951 | B2 * | 2/2008 | Yeh ............................. 327/337 |
| 2005/0088263 | A1 | 4/2005 | Behzad |
| 2006/0128339 | A1 | 6/2006 | Petrovic |

OTHER PUBLICATIONS

Hyunwon Moon, Sungweon Kang, Youn Tae Kim, Kwyro Lee; "A Fully Differential LC-VCO Using a New Varactor Control Structure", Sep. 2004, pp. 410-412, IEEE Microwave and Wireless Components Letters, vol. 14, No. 9.

* cited by examiner

*Primary Examiner*—Arnold Kinkead
(74) *Attorney, Agent, or Firm*—Myers Dawes Andras & Sherman, LLP; Kenneth L. Sherman, Esq.; Michael Zarrabian, Esq.

(57) ABSTRACT

A method and apparatus for varactor bank switching for a voltage controlled oscillator is disclosed. Varactor bank switching involves generating a negative bias voltage signal as a control signal for a varactor bank switch in an off-state, the varactor bank switch comprising a pass-gate circuit including switching transistors. Generating the negative bias voltage signal includes employing an active rectifier circuit running at the speed of an oscillation signal, the negative bias voltage signal maintaining the gate-source voltage of the pass-gate circuit below a threshold voltage to prevent said switching transistors from becoming conductive in an off-state.

1 Claim, 5 Drawing Sheets

VARACTOR BANK SWITCHING BASED ON NEGATIVE CONTROL VOLTAGE GENERATION

BACKGROUND OF THE INVENTION

1. Field of the Invention

The present invention relates generally to varactor bank switching, and in particular to configuration of varactor bank switches.

2. Background Information

Varactor banks are applied in LC-tank voltage controlled oscillators (VCO) to perform a coarse tuning of the oscillation frequency. LC-tank oscillators are typically used in communication systems, such as in generating high frequency oscillator signals in microwave or radio frequency apparatus. A typical LC-tank circuit includes inductors (L) and capacitors (C) configured in a circuit such that the inductors and capacitors oscillate because of current or voltage exchange between inductors and capacitors at a specified frequency. To achieve a high Cmax/Cmin-ratio, switches are used in the varactor bank, where Cmax and Cmin denote the maximum and minimum capacitance values of the varactor at e.g., a logical low and high biasing voltage. If the process technology provides varactors with an inherently high variability of the capacitance, i.e., a high Cmax/Cmin-ratio, the variable capacitors in the varactor bank can directly be driven by a control signal (i.e., logical low for Cmax and logical high for Cmin) and dedicated switches within the varactor banks are not necessary. This invention, however, assumes that the process technology available (e.g. a typical digital CMOS process for mainstream applications) does only provide varactors with a low or medium Cmax/Cmin-ratio, which requires the application of switches to maximize the overall Cmax/Cmin-ratio of the varactor bank.

If the varactor bank switches in the off-state become conductive during certain fractions of the oscillation period, the phase noise of the LC-tank VCO may significantly degrade. FIG. 1 shows a schematic of a conventional varactor bank circuit, illustrating the problem that the varactor bank switch in the off-state becomes conductive during certain fractions of the oscillation period. The varactor bank is part of a tuning capacitance. The circuit in FIG. 1 includes two MOSFET varactors M4, M5 whose diffusion-side terminals are connected to the source and drain nodes of a NMOS FET switch M1. In this configuration the source and drain potentials of M1 are floating in the on-state of the varactor bank. To prevent uncontrolled variations of the potentials at these nodes, two additional MOSFET switches M2 and M3 are connected between ground and the drain and source nodes of M1. All of the transistors M1-M3 are either turned on if the varactor bank is enabled or turned off if the varactor bank is disabled. M1 is much bigger than M2 and M3 because it has to provide a low impedance path for the oscillator signal propagating from M5 to M4 and vice versa. M2 and M3 are only used to provide a high impedance dc path such as to appropriately bias the source and drain nodes of M1.

A disadvantage of the circuit in FIG. 1 is that the switch transistor M1 can get turned on in the off-state, if the source potential becomes sufficiently negative such that Vgs of M1 is higher than the threshold voltage Vth despite the gate potential of M1 is 0V (i.e., the control signal Vctrl is 0V. This situation typically occurs in the areas around the peak values of the negative-going half-waves of the oscillation signal and the described effect increases the larger the signal swing becomes. This phenomenon occurs in both half-waves of the oscillation period because the source and drain nodes exchange their roles in this symmetrical varactor bank design with respect to the definition of the half-wave directions. During those fractions of the oscillation period where Vgs>Vth holds true, the switch transistor M1 becomes conductive despite the fact that it should remain turned off. The time intervals where M1 becomes conductive are indicated by waveforms in FIG. 1 as horizontal arrows below the actual oscillation signal curve.

The impact of these partially conductive states on the phase noise performance is shown in Table I below, which summarizes certain measured results of a VCO design in 45 mn CMOS technology that applies the varactor bank switching of FIG. 1. It is clear that the phase noise performance in the off-state of the varactor banks is worse by at least 12 dBc/Hz compared to the case where the varactor bank switches are turned on. A phase noise degradation of more than 12 dBc/Hz can be regarded as being quite significant in high-Q VCO design.

TABLE I

| | | all varactors banks | phase noise at 1 MHz offset |
|---|---|---|---|
| low frequency range | all secondary coils open | off | −114.2 dBc/Hz |
| | | on | −121.6 dBc/Hz |
| mid frequency range | outer secondary coil closed | off | −107.5 dBc/Hz |
| | | on | −119.4 dBc/Hz |
| high frequency range | outer and inner secondary coils closed | off | −101.5 dBc/Hz |
| | | on | −119.4 dBc/Hz |

Measurement results of implemented prior art circuit in a 45 nm CMOS technology CMOS SOI12S. The phase noise degradation owing to the partially conductive switches in the off-state of the varactor banks is more than 12 dBc/Hz.
Note that the first two columns refer to the additionally implemented inductor switching, which is, however, not directly related to the discussed problem of varactor bank switching.

SUMMARY OF THE INVENTION

A method and apparatus for varactor bank switching for a voltage controlled oscillator, is disclosed. One embodiment involves generating a negative bias voltage signal as a control signal for a varactor bank switch in an off-state, the varactor bank switch comprising a pass-gate circuit including switching transistors; wherein generating the negative bias voltage signal includes employing an active rectifier circuit running at the speed of an oscillation signal, the negative bias voltage signal maintaining the gate-source voltage of the pass-gate circuit below a threshold voltage to prevent said switching transistors from becoming conductive in an off-state.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the invention, as well as a preferred mode of use, reference should be made to the following detailed description read in conjunction with the accompanying drawings, in which.

DESCRIPTION OF THE PREFERRED EMBODIMENTS

Figure 1:
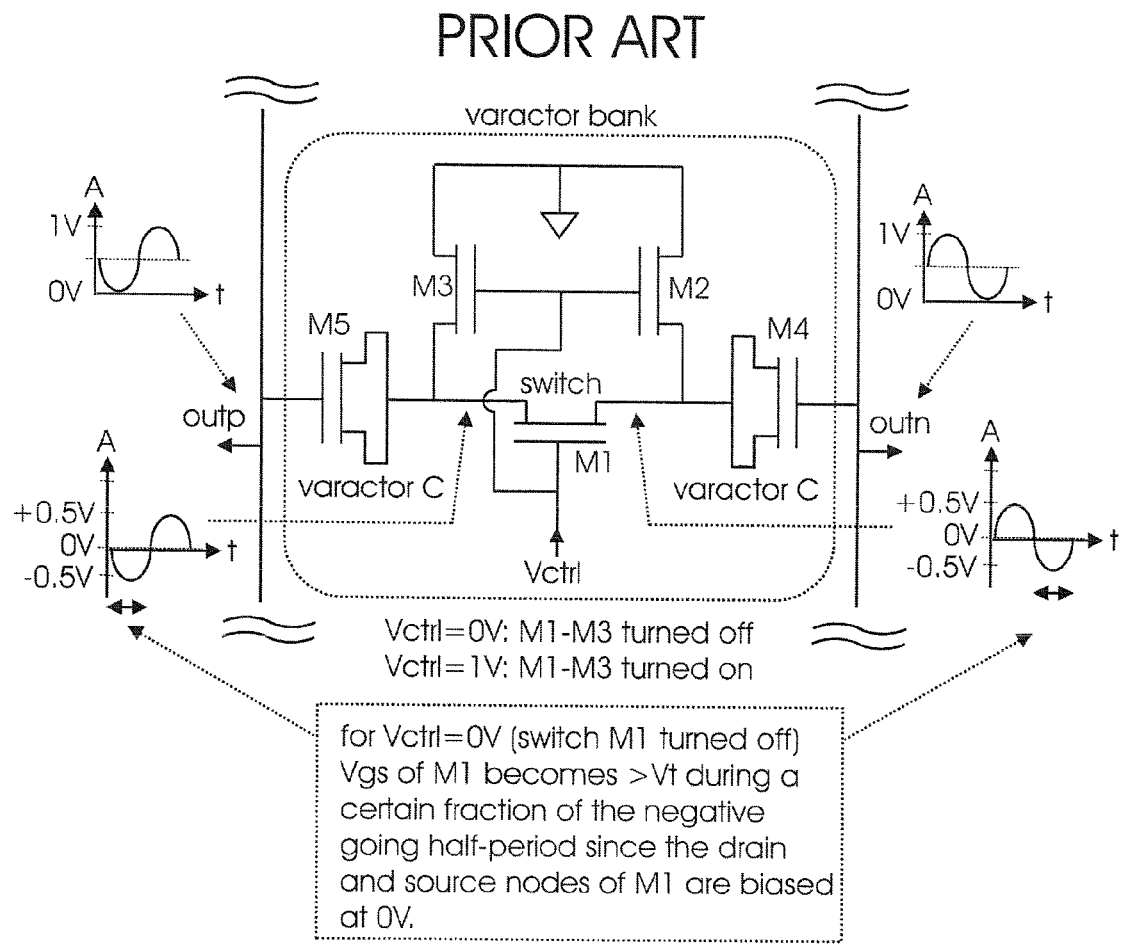
FIG. 1 shows a schematic of a conventional varactor bank switch, illustrating that the varactor bank switch in the off-state becomes conductive during certain fractions of the oscillation period.

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

The description may disclose several preferred embodiments of varactor banks, as well as operation and/or component parts thereof. While the following description will be described in terms of varactor bank for LC-tank voltage controlled oscillators for clarity and to place the invention in context, it should be kept in mind that the teachings herein may have broad application to all types of oscillators.

The embodiments described below disclose a new system for varactor bank switching by generating a negative bias voltage signal such as a control signal. According to one general embodiment, varactor bank switching based on generating a negative bias voltage signal as a control signal for a varactor bank switch in an off-state is provided that prevents the varactor bank switch from getting turned on during certain fractions of the oscillation signal period despite the varactor bank switch being in the off-state.

An embodiment of varactor bank switching according to the invention involves generating a negative bias voltage signal as a control signal for a varactor bank switch in an off-state, the varactor bank switch comprising a pass-gate circuit including switching transistors; wherein generating the negative bias voltage signal includes employing an active rectifier circuit running at the speed of an oscillation signal, the negative bias voltage signal maintaining the gate-source voltage of the pass-gate circuit below a threshold voltage to prevent said switching transistors from becoming conductive in an off-state.

The negative bias voltage is generated by an active rectifier circuit that runs at the speed of the oscillation signal. The negative control signal (negative bias voltage) assures that the gate-source voltage of the varactor bank switching transistors remains below their threshold voltage. As a result, the switching transistors do not become conductive when they are in the off-state. The negative bias voltage can either be (1) used as a replacement of a logical low control signal or (2) be superimposed to an already existing logical low control signal applied to the gate nodes of the actual varactor bank switching transistors.

The invention is applicable to all common mode voltage ranges of the oscillation signal as long as the negative control signal (negative bias voltage) in the off-state of the varactor bank switch is lower than the common mode voltage, minus the threshold voltage of the varactor bank switching transistors.

Figure 2A:
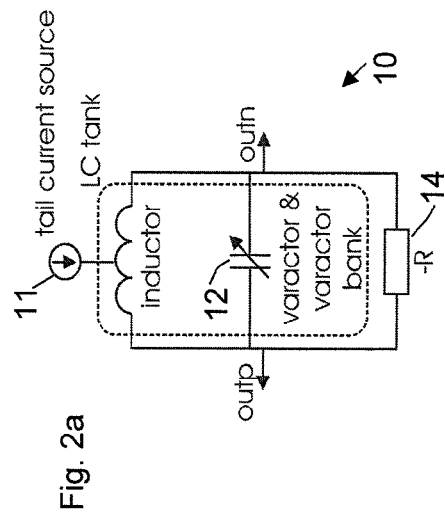
FIGS. 2a-d show equivalent circuits of an LC oscillator using a PMOS tail current source together with a varactor bank switch connected in parallel to an inductor coil, according to embodiments of the invention.
Figure 2D:
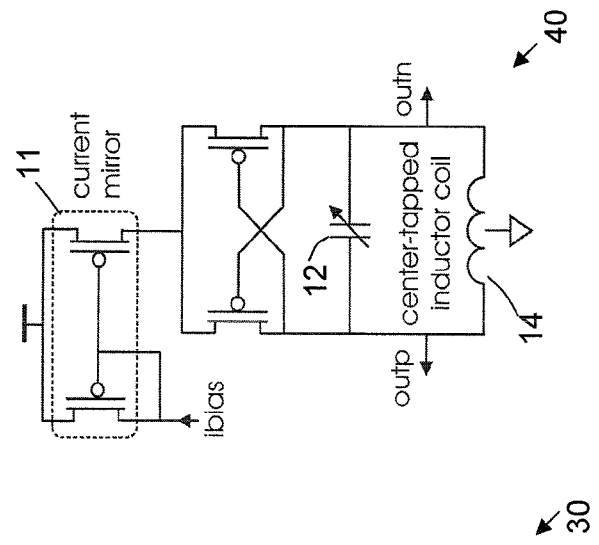
Figure 2C:
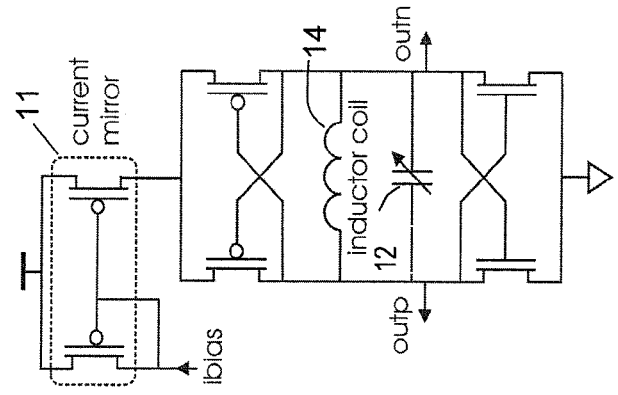
Figure 2B:
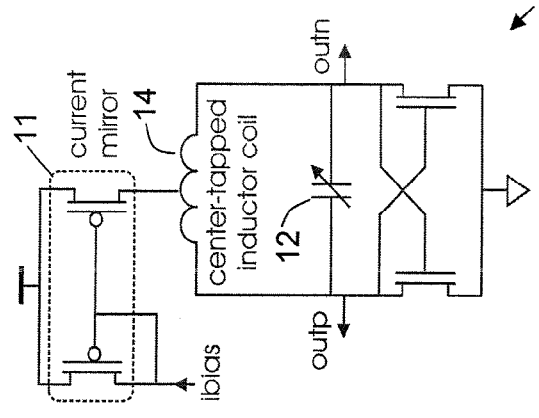

FIG. 2a shows a generic equivalent topology (i.e., circuit) of an LC VCO 10, and FIGS. 2b-2d show additional different topologies of LC VCOs 20, 30, 40, respectively, each using a PMOS tail current source 11 together with a varactor bank system 12 according to an embodiment of the invention, connected in parallel to the inductor coil 14. The three topologies 20, 30 and 40, differ by the co--on mode voltage of the output signal. While topology 20 has a high output common mode voltage because of the center-tapped inductor coil that is connected to the tail current source, the output common mode voltage of topology 40 is low due to the ground connection of the inductor center tap. Topology 30 uses a 2-port inductor that is located in between two PMOS and NMOS cross-coupled transistor pairs and hence the output common mode voltage is in the middle of the supply voltage.

Figure 3:
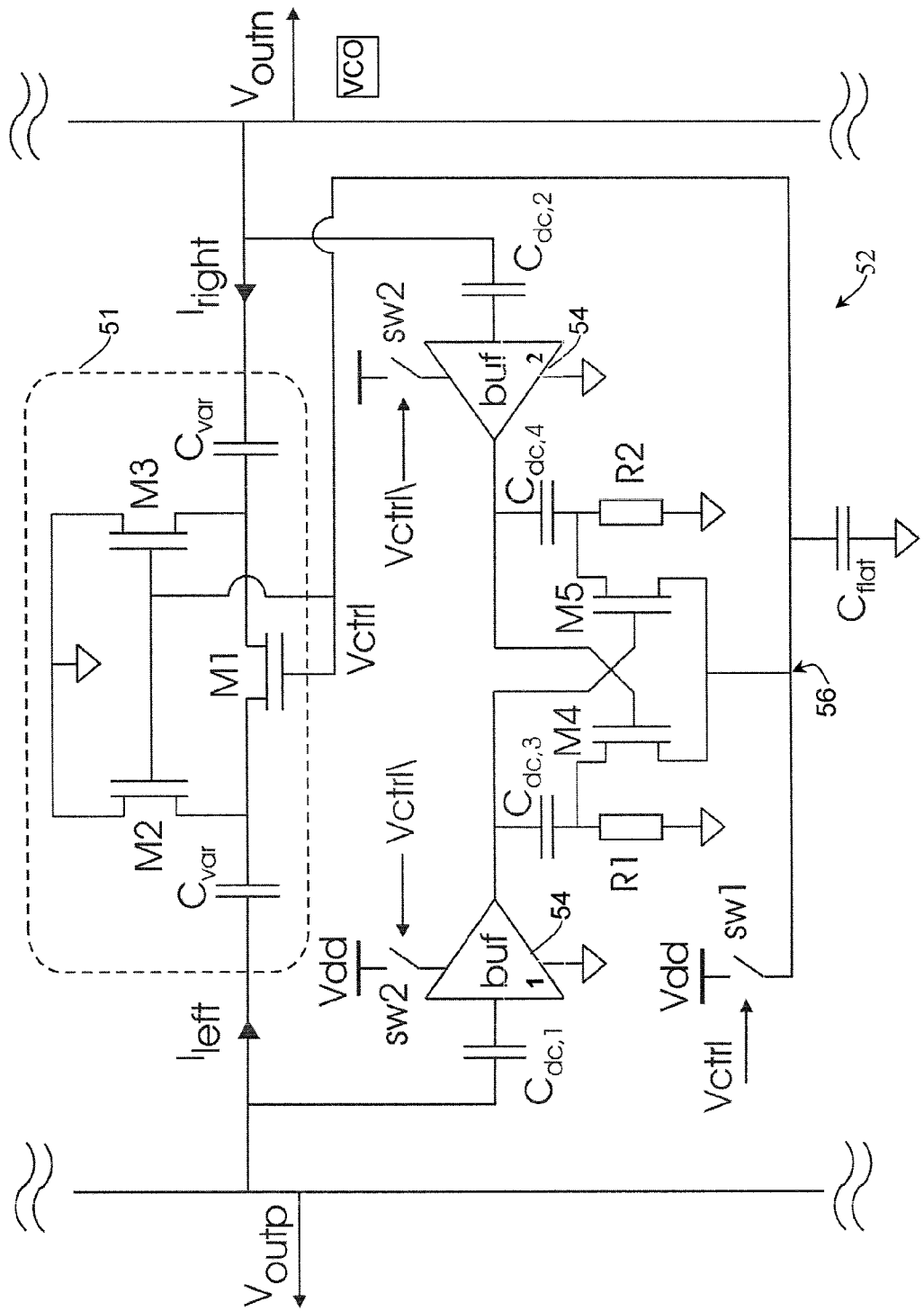
FIG. 3 shows details of a varactor bank switching topology implementing negative bias voltage generation for a control signal of varactor bank switch, according to an embodiment of the invention.

An example varactor bank switch topology according to the invention is described blow, suitable for VCO topologies. FIG. 3 shows a varactor switch topology 50 implementing the varactor bank system 12 according to an embodiment of the invention. The varactor switch topology 50 includes a varactor switch 51 (pass-gate circuit) and a control voltage circuit 52 generating a negative bias voltage signal as a control signal for the varactor bank switch 51 in an off-state. The output signals outp (positive output of a VCO) and outn (negative output of a VCO) are first ac-coupled (alternate current coupled) via capacitors $C_{dc1}$, $C_{dc,2}$ to the inputs of two buffers 54. Power-down switches sw2 above both buffers are configured such that the buffers can be disabled.

The outputs of the buffers preferably have a rail-to-rail swing and are differential or complementary to each other. The buffer outputs are level-shifted using dc-blocking (direct current block) capacitors $C_{dc3}$, $C_{dc,4}$. Further, resistors R1 and R2 provide a dc path from the source nodes of cross-coupled transistors M4, M5 to ground. The FETs M4 and M5 have a common drain node that is connected to the gate of the actual varactor switching transistor M1.

The topology 50 is implemented according to the invention in order for the varactor 51 to remain in a non-conductive state while in an off-state, thereby satisfying inequality (1) below:

$$Vgs,M1n(t)=Vctrl-(Vcm-Vshift-Vswing/2.\sin(2\pi f_{osc}t))<Vth,M1n \quad (1)$$

where Vgs,M1 is the gate-source voltage of the switch transistor, Vctrl denotes the control signal applied to the gate of the varactor switch transistor M1, Vcm is the common mode voltage level at the drain or source nodes of the switch transistor M1, Vswing is the voltage swing of the oscillation signal, $2\pi f_{osc}t$ denotes the instantaneous phase of the oscillation signal and Vth,M1n is the threshold voltage of the switch transistor M1.

Relation (1) shows that partially conductive states in the off-state of the varactor bank may still occur if either the output common mode voltage is low or the oscillation signal has a very high swing. In both cases, the gate-source voltage of the NMOS switch transistor M1n becomes higher than its threshold voltage and the transistor begins to become conductive though it should remain in the off-state. To prevent this, the circuit 52 superimposes the control signal of the varactor switch 51 in the off-state with a negative offset voltage such that the gate voltage of the switch transistor M1 is pulled down below 0V by the value of the negative offset voltage. The inequality in relation (1) can then be extended as shown in relation (2) below by a term Voffset, which can be traded for either a lower output common mode voltage or a higher swing:

$$Vgs,M1n(t)=Vctrlp-(Vcm-Vshift-Vswing/2.\sin(2\pi f_{osc}t))-Voffset<Vth,M1n \quad (2)$$

Because of the complementary output signals, one of the buffer outputs is high while the other is low. If for example the buffer buf1 has a low-going output and the buffer buf2 has a high-going output, the transistor M4 is turned on because its gate node is connected to the buf2 output and it feeds the negative source control voltage (which became negative due to the level-shifting through $C_{dc,3}$) to the common drain node 56. If the buffer outputs change, the transistors M4 and M5 also change their roles and M5 starts providing the negative voltage to the common drain node 56. An additional capacitor Cflat is connected to the common drain node 56 to flatten any ripples that may occur when switching from M4 to M5 and vice versa.

If the varactor switch 51 must be enabled, the power-down switches sw2 above both buffers buf1, buf2, are opened and the switch sw1 is closed to provide a logical high signal to the gate of the varactor switching transistor M1. The negative bias voltage generation circuit 52 can also be regarded as an active rectifier that operates at the oscillation frequency of the VCO. The generated negative voltage ripples occur at twice the oscillation frequency and can be filtered easily. Hence the ripples should be of no concern for the operation of the extended varactor bank switch within a phase-locked-loop (PLL) circuit.

Figure 4:
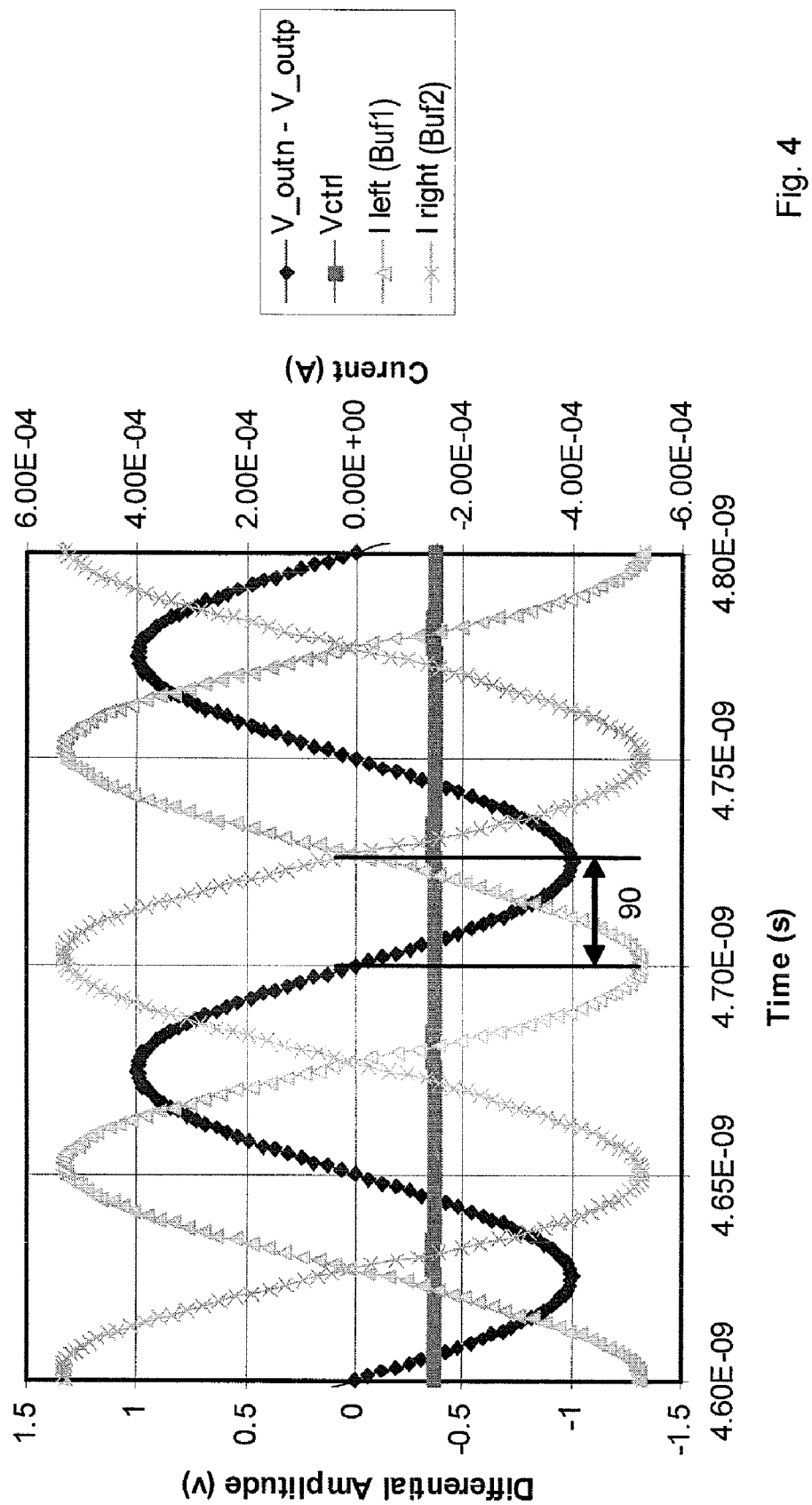
FIG. 4 shows example simulation results of voltage across an LC-tank and currents through varactors and the control voltage applied to a varactor switch if the varactor switch transistor M1 in topology of FIG. 3 is disabled.

FIG. 4 shows example simulation results of a switching topology method based on a negative bias voltage as the control signal of the varactor switch is in the off-state, according to the invention. In this example the circuit 52 (FIG. 3) generates a constant negative offset voltage of –0.35V. This negative offset voltage is generated with the circuit 52 running at 10 GHz. The voltage across the LC-tank is 90-degree phase-shifted with respect to the current flowing through the varactors Cvar. FIG. 4 shows the voltage across the LC-tank and currents through the varactors Cvar as well as the control voltage applied to the varactor switch, if the switch transistor M1 is disabled.

Figure 5:
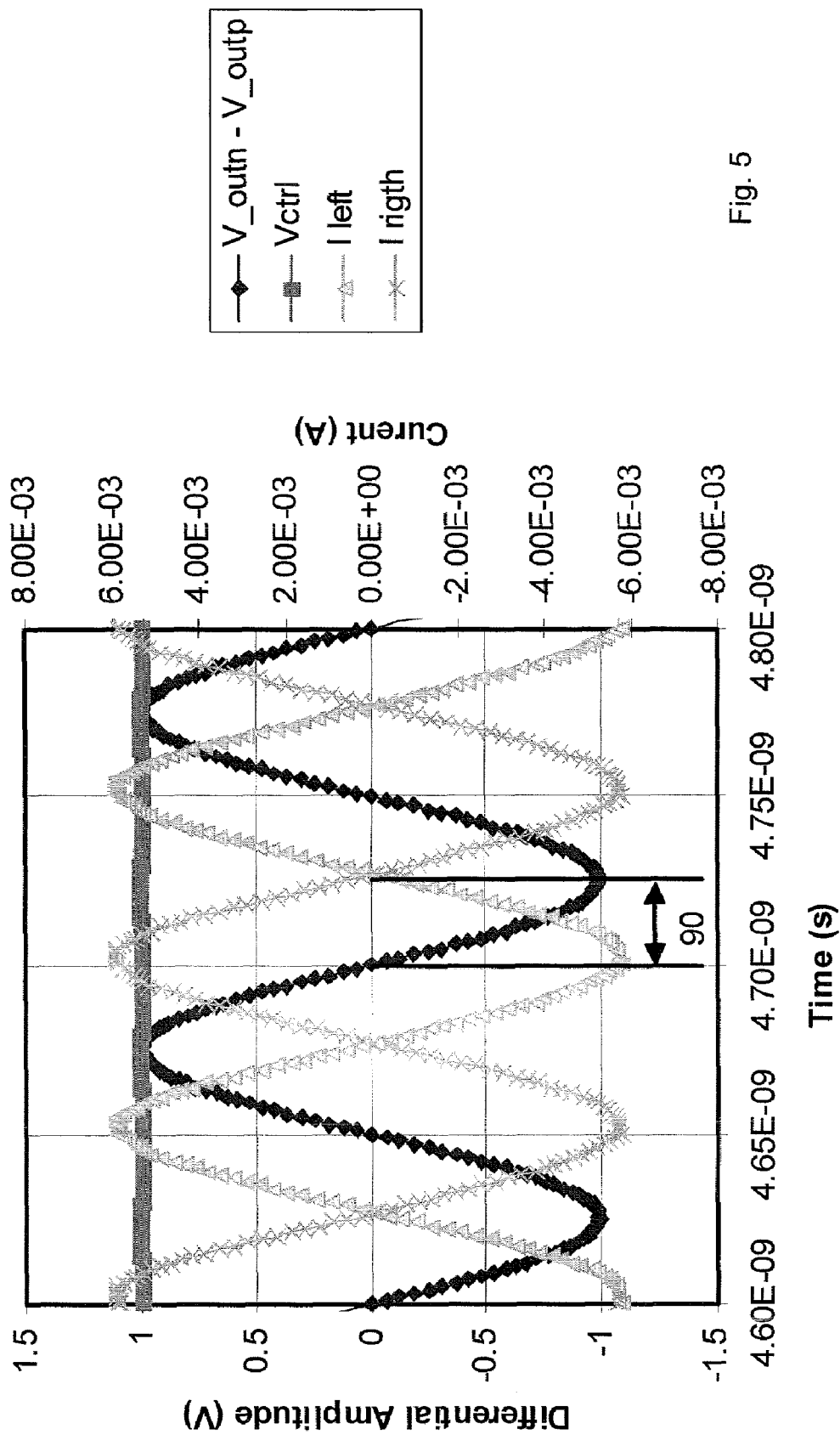
FIG. 5 shows example simulation results of a voltage across an LC-tank and currents through varactors and the control voltage applied to a varactor switch if the varactor switch transistor M1 in topology of FIG. 3 is enabled.

Referring to the example simulation results of FIG. 5, the same relations are obtained for the case where the varactor switch 51 (FIG. 3) is turned on by a logical high signal applied to the gate of M1. The voltage-to-current phase relationship is again 90-degrees. FIG. 5 shows the voltage across the LC-tank and currents through the varactors as well as the control voltage applied to the varactor switch, if the switch transistor M1 is enabled.

As is known to those skilled in the art, the aforementioned example embodiments described above, according to the present invention, can be implemented in many ways, such as program instructions for execution by a processor, as software modules, as computer program product on computer readable media, as logic circuits, as silicon wafers, as integrated circuits, as application specific integrated circuits, as firmware, etc. Though the present invention has been described with reference to certain versions thereof, however, other versions are possible. Therefore, the spirit and scope of the appended claims should not be limited to the description of the preferred versions, contained herein.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A method of varactor bank switching for an oscillator, comprising:
    generating a negative bias voltage signal as a control signal for a varactor bank switch in an off-state, the varactor bank switch comprising a pass-gate circuit including switching transistors;
    wherein generating the negative bias voltage signal includes employing an active rectifier circuit running at the speed of an oscillation signal, the negative bias voltage signal maintaining the gate-source voltage of the pass-gate circuit below a threshold voltage to prevent said switching transistors from becoming conductive in an off-state.

* * * * *